(12) United States Patent
Tian et al.

(10) Patent No.: US 12,463,097 B2
(45) Date of Patent: Nov. 4, 2025

(54) SEMICONDUCTOR DEVICE WITH REDUCED STRESS DIE PICK AND PLACE

(71) Applicant: Sandisk Technologies, Inc., Milpitas, CA (US)

(72) Inventors: Xin Tian, Shanghai (CN); Junrong Yan, Shanghai (CN); Chee Keong Chin, Shanghai (CN); Weili Wang, Shanghai (CN); Yang Lei, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 798 days.

(21) Appl. No.: 17/174,802

(22) Filed: Feb. 12, 2021

(65) Prior Publication Data

US 2022/0181208 A1 Jun. 9, 2022

Related U.S. Application Data

(60) Provisional application No. 63/121,047, filed on Dec. 3, 2020.

(51) Int. Cl.
| | | |
|---|---|---|
| *H01L 21/78* | (2006.01) | |
| *H01L 21/683* | (2006.01) | |
| *H01L 23/00* | (2006.01) | |

(52) U.S. Cl.
CPC .......... *H01L 21/78* (2013.01); *H01L 21/6838* (2013.01); *H01L 24/27* (2013.01);
(Continued)

(58) Field of Classification Search
CPC ............ H01L 21/6835; H01L 21/6836; H01L 21/6838; H01L 21/304; H01L 21/3046; H01L 21/02013; H01L 21/02021; H01L 21/463; H01L 21/78-786; H01L 21/3043; H01L 2924/00014; H01L 2224/2763; H01L 2224/83855; H01L 2224/27001; H01L 2224/27436; H01L 2224/2919; H01L 2224/45099; H01L 2224/83856; H01L 2224/48091; H01L 2224/48227; H01L 2224/83191; H01L 24/27; H01L 24/83; H01L 24/29; H01L 24/48; H01L 21/67132; H01L 21/67144; H01L 2924/15311; H01L 2924/181
See application file for complete search history.

(56) References Cited

U.S. PATENT DOCUMENTS 6,083,811 A * 7/2000 Riding ................ H01L 21/6836
438/464
8,703,583 B2 * 4/2014 Maki ................... H01L 21/6836
438/464
(Continued)

*Primary Examiner* — Julio J Maldonado
*Assistant Examiner* — Stanetta D Isaac
(74) *Attorney, Agent, or Firm* — Pearl Cohen Zedek Latzer Baratz LLP

(57) ABSTRACT

Semiconductor dies formed on a wafer may be picked from the wafer with little or no stress, thus preventing cracking and damage to the semiconductor dies. A die attach film (DAF) layer is laminated onto an inactive surface of the wafer and the DAF layer is cut in the outline of the dies. The inactive surface of the wafer may then be supported on a vacuum chuck without using a dicing tape, and dies transferred from the wafer using a pick and place robot.

12 Claims, 9 Drawing Sheets

(52) U.S. Cl.
CPC ...... *H01L 24/83* (2013.01); *H01L 2224/2763* (2013.01); *H01L 2224/83855* (2013.01)

(56) References Cited

U.S. PATENT DOCUMENTS

| | | | |
|---|---|---|---|
| 2005/0019980 A1* | 1/2005 | Kurosawa | H01L 21/6835 438/107 |
| 2014/0097526 A1* | 4/2014 | Suleiman | H01L 23/49503 257/E21.705 |
| 2017/0053830 A1* | 2/2017 | Haimoto | H01L 21/304 |
| 2019/0122928 A1* | 4/2019 | Norimoto | H01L 21/304 |
| 2019/0221479 A1* | 7/2019 | Okita | H01L 21/78 |

* cited by examiner

SEMICONDUCTOR DEVICE WITH REDUCED STRESS DIE PICK AND PLACE

CLAIM OF PRIORITY

The present application claims priority from U.S. Provisional Patent Application No. 63/121,047, entitled "SEMICONDUCTOR DEVICE WITH REDUCED STRESS DIE PICK AND PLACE," filed Dec. 3, 2020, which application is incorporated by reference herein in its entirety.

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid-state drives.

While many varied packaging configurations are known, flash memory semiconductor devices may in general be assembled as system-in-a-package (SIP) or multichip modules (MCM), where a plurality of semiconductor dies are mounted and interconnected to an upper surface of a small footprint substrate. Die attach films (DAF) are typically used to bond semiconductor dies to each other and the substrate. Typically, DAF is attached to the back (inactive) side of an entire semiconductor wafer prior to dicing of the individual semiconductor die. A dicing tape is also applied over the DAF to hold the respective die together after dicing. After the DAF and dicing tape are applied, the wafer may be cut, for example with a dicing saw, and a pick and place robot may peel the semiconductor die and DAF layer away from the dicing tape for assembly into the semiconductor die package.

Current and next generation semiconductor dies are formed of large numbers of memory array layers. While increasing memory storage capacity, these dies have large numbers of metal interconnect layers and a thin profile, making the dies more fragile and more susceptible to chipping, cracking and micro damage during assembly. Tests have shown this is especially true during the die pickup process, where the semiconductor die is peeled from the dicing tape.

DETAILED DESCRIPTION

The present technology will now be described with reference to the figures, which in embodiments, relate to a semiconductor wafer and dies fabricated therefrom, where the dies may be picked from the wafer with little or no stress, thus preventing cracking and damage to the semiconductor dies. In embodiments, the semiconductor dies may be diced from the wafer using a combination of a partial dice before grind step and then backgrinding of the wafer. Thereafter, a die attach film (DAF) layer is laminated onto the inactive surface of the wafer and the DAF layer is cut in the outline of the semiconductor dies. The inactive surface of the wafer may then be supported on a vacuum chuck without using a dicing tape. As the semiconductor dies and DAF are already cut, and need not be peeled off of a dicing tape, the dies may be easily removed by a pick and place robot.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5%.

For purposes of this disclosure, a connection may be a direct connection or an indirect connection (e.g., via one or more other parts). In some cases, when a first element is referred to as being connected, affixed or coupled to a second element, the first and second elements may be directly connected, affixed or coupled to each other or indirectly connected, affixed or coupled to each other. When a first element is referred to as being directly connected, affixed or coupled to a second element, then there are no intervening elements between the first and second elements.

Figure 1:
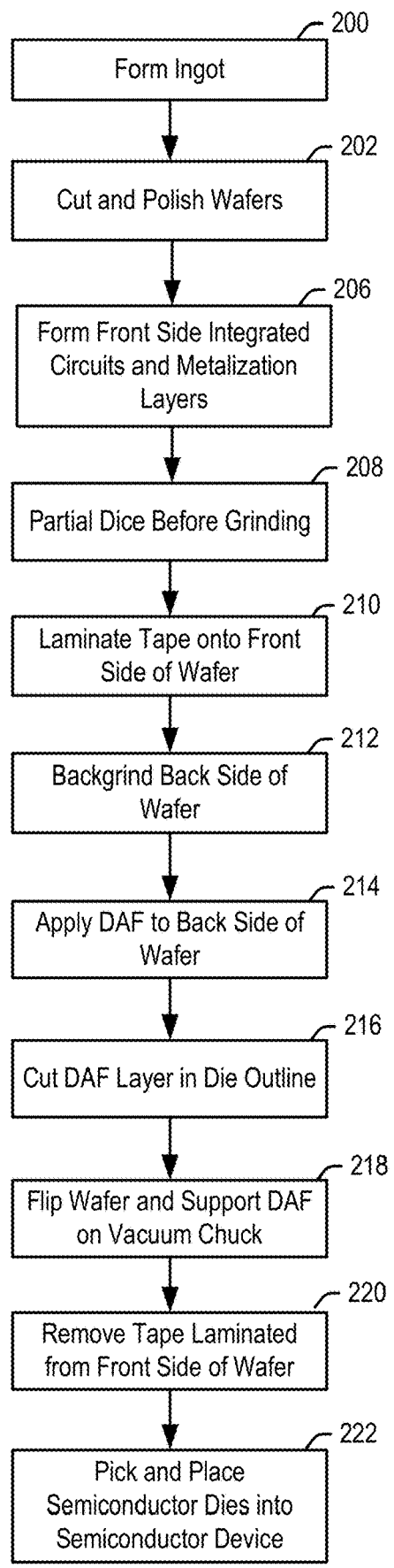
FIG. 1 is a flowchart for forming a semiconductor die according to embodiments of the present technology.
Figure 2:
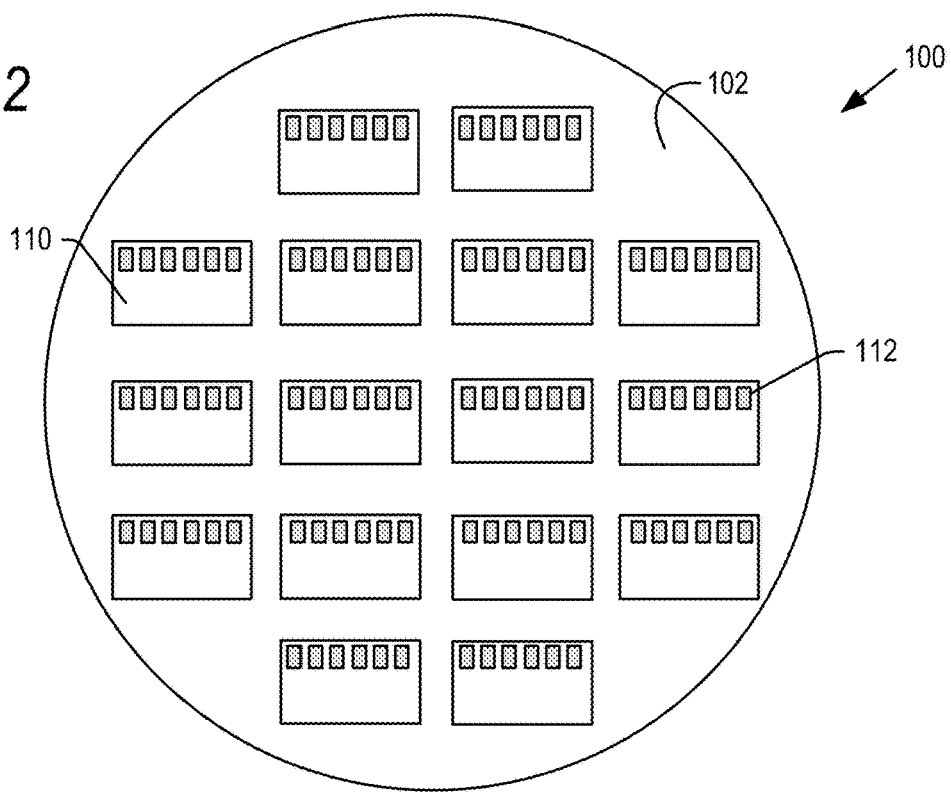
FIG. 2 is a front view of a semiconductor wafer showing semiconductor dies formed in and/or on a first major surface of the wafer.
Figure 3:
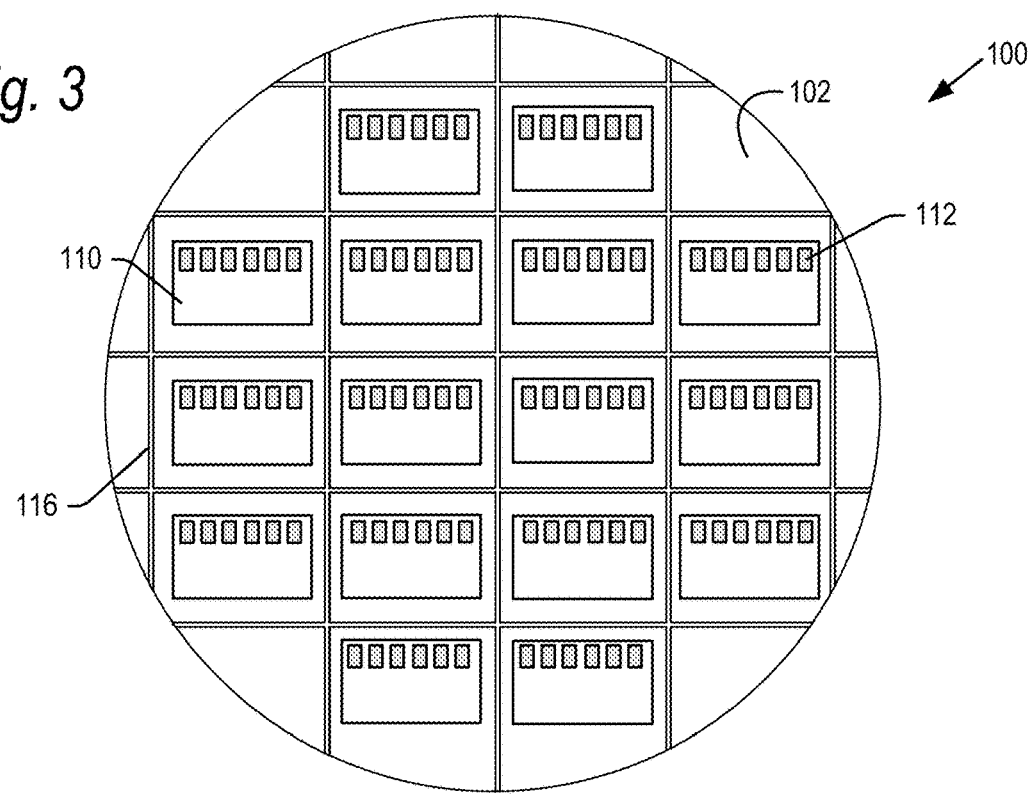
FIG. 3 is a front view of the first major surface of the semiconductor wafer after a partial dice before grind step.
Figure 4:
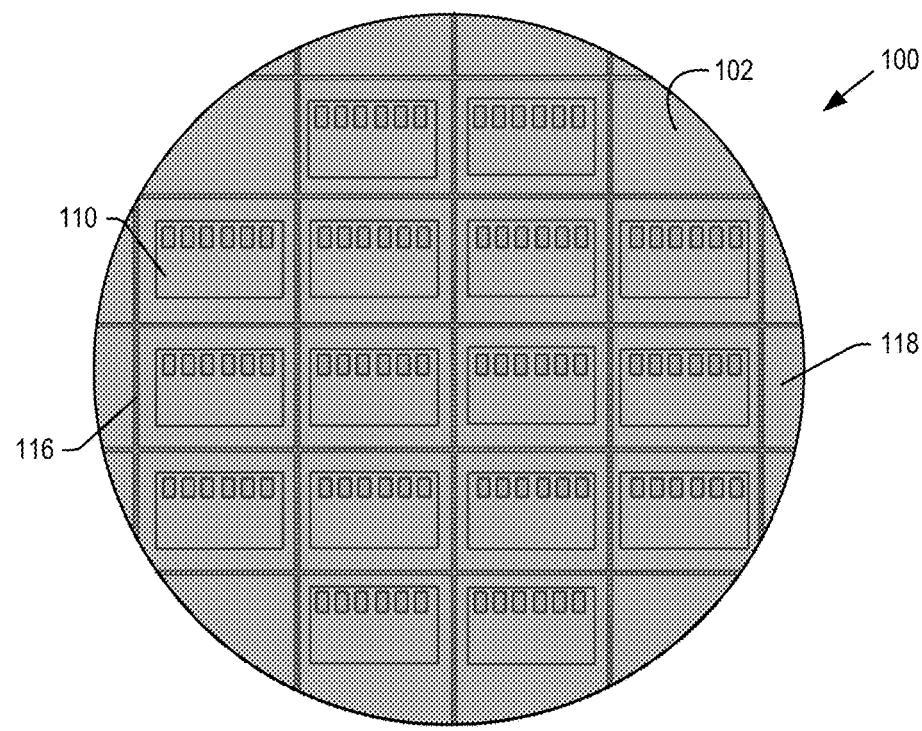
FIG. 4 is a front view of the first major surface of the semiconductor wafer after lamination of a grinding tape.

An embodiment of the present technology will now be explained with reference to the flowcharts of FIG. 1, and the views of FIGS. 2-17. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments. In step 202, the semiconductor wafer 100 may be cut from an ingot and polished on both the first major surface 102 (FIG. 2), and second major surface 104 (FIG. 7) opposite surface 102, to provide smooth surfaces. At this point during fabrication, semiconductor wafer 100 may be about 760 microns (µm).

In step 206, the first major surface 102 may undergo various processing steps to divide the wafer 100 into respective semiconductor dies 110 (FIGS. 2 and 3), and to form integrated circuits of the respective semiconductor dies 110 in the first major surface 102. The integrated circuits may be electrically coupled to die bond pads 112 on the first major surface 102 of wafer 100 by multiple layers of metal interconnects and vias. Surface 102 including the integrated circuits is also referred to herein as the active surface 102, and surface 104 is also referred to as the inactive surface.

In embodiments, the semiconductor dies 110 may for example be memory dies such as 2D NAND flash memory or 3D BiCS (Bit Cost Scaling), V-NAND or other 3D flash memory, but other types of dies 110 may be used. These other types of semiconductor die include but are not limited to a controller die such as an ASIC, or RAM such as an SDRAM, DDR SDRAM, LPDDR and GDDR. The number of semiconductor dies 110 shown on wafer 100 in the figures is for illustrative purposes, and wafer 100 may include more semiconductor dies 110 than are shown in further embodiments. Similarly, the number of die bond pads 112 shown on semiconductor dies 110 in the figures is for illustrative purposes, and the dies 110 may include more bond pads 112 than are shown in further embodiments.

After formation of the semiconductor dies 110, the wafer 100 may undergo a partial dice before grind in step 208. In particular, cut lines 116 (FIGS. 3-5) may be made partially through the first major surface 102 of wafer 100. A first set of cut lines 116 may be made horizontal, or otherwise parallel to a first edge of the dies 110, and a second set of cut lines 116 may be vertical, or otherwise parallel to a second edge of the dies 110. The cut lines 116 may be made in a kerf width or keep-out area surrounding each semiconductor die 110.

The cut lines 116 may be made with a saw blade, waterjet or chemical etch. In further embodiments, the cut lines may be made by a laser, either cutting down through the partial depth of the wafer, or by generating localized voids down through the partial depth of the wafer in a stealth lasing process. In such a process, the laser may be focused at different depths beneath the surface of the wafer to create the localized voids at different depths in the desired locations of the cut lines. When the wafer is thereafter stressed, for example in the backgrind process explained below, the wafer fractures along crystalline planes through and between the localized voids to create the partial depth cut lines 116. Other methods of creating cut lines 116 are contemplated.

The cut lines 116 may extend partially through the wafer 100 from the first major surface, for example to a depth of about 65 µm. At this point in the wafer fabrication, the semiconductor wafer is full thickness (about 760 µm). The partial cut lines 116 may be made shallower or deeper than 65 µm in further embodiments. However, in embodiments, the cut lines 116 are made to a depth which is equal to or greater than a final thickness of the semiconductor wafer after backgrinding of the wafer as explained below. In embodiments, this final wafer thickness may for example be about 25 µm to 36 µm, though this final thickness may be thinner or thicker than that in further embodiments.

Figure 5:
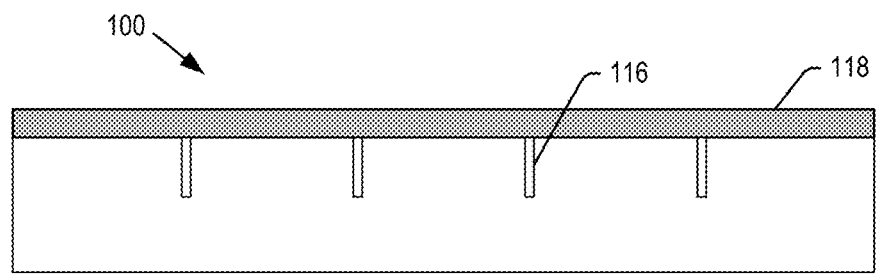
FIG. 5 is an edge view of the semiconductor wafer after lamination of a grinding tape.

After the partial cut in step 208, a layer of tape, referred to as backgrind tape 118 (FIGS. 4 and 5), may be laminated onto the first major surface 102 of wafer 100 in step 210. FIG. 5 is an edge view showing the partial cuts 116 through the first major surface 102, and the backgrind tape 118 laminated onto the first major surface 102. The relative thicknesses of wafer 100 and backgrind tape 118 shown in the figures is by way of example and is not to scale.

Figure 6:
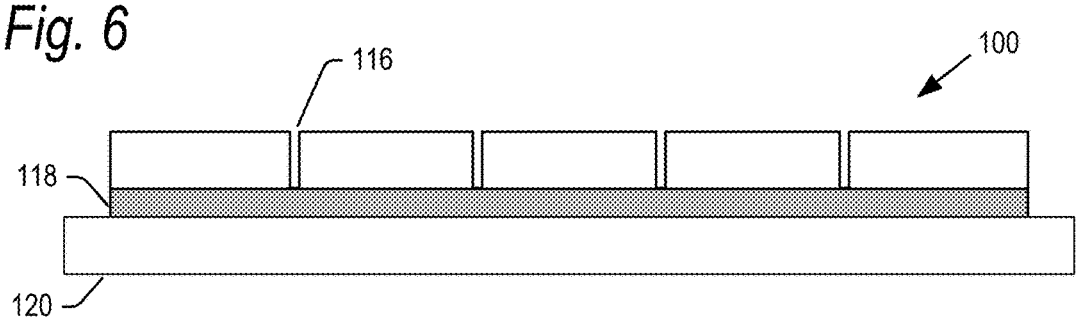
FIG. 6 is an edge view of the semiconductor wafer after thinning of the wafer.

The wafer 100 may then be flipped and the first major surface 102, covered by the backgrind tape 118, may be supported on a chuck 120, shown schematically in FIG. 6. The second major surface 104 of wafer 100 may then be thinned in step 212 using a grinding wheel (not shown). The grinding wheel may thin the wafer 100 from, for example, 760 µm to its final thickness of for example about 25 µm to 36 µm. It is understood that the wafer 100 may be thinner or thicker than this range after the backgrind step in further embodiments.

As noted above, in embodiments, the wafer is thinned to a final thickness that is less than the depth of the cut lines 116. In such embodiments, the semiconductor dies are completely diced, or separated from each other, after the backgrind step, as shown in FIG. 6. The dies are held together in the wafer 100 at this stage in the fabrication by the backgrind tape 118.

Figure 7:
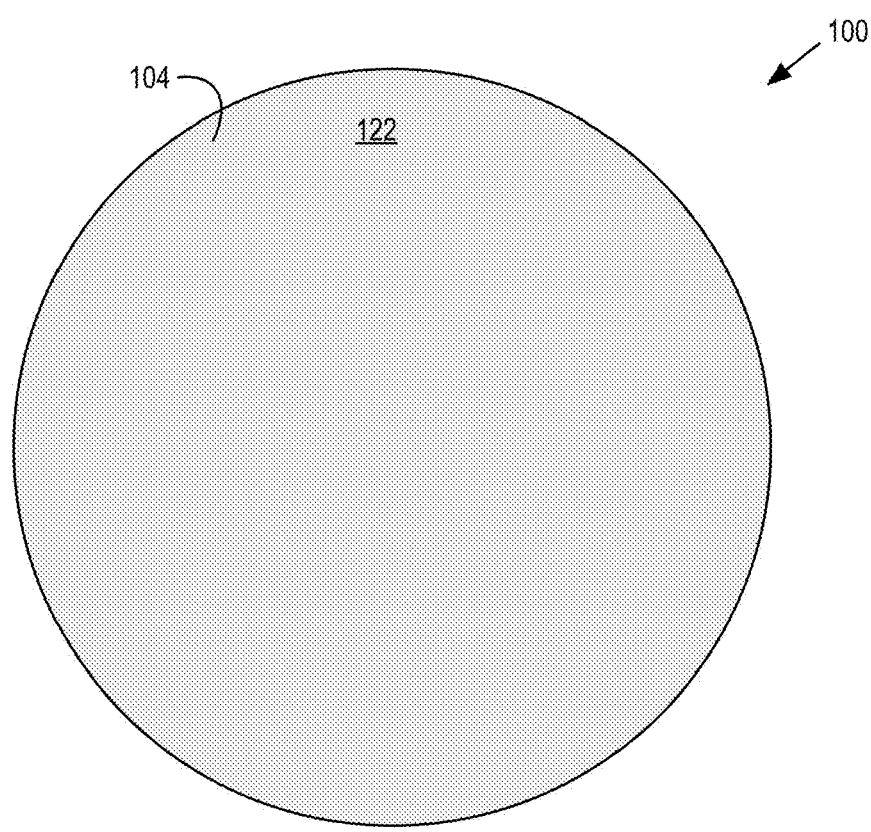
FIG. 7 is a rear view of the second major surface of the semiconductor wafer after lamination of a DAF layer.
Figure 8:
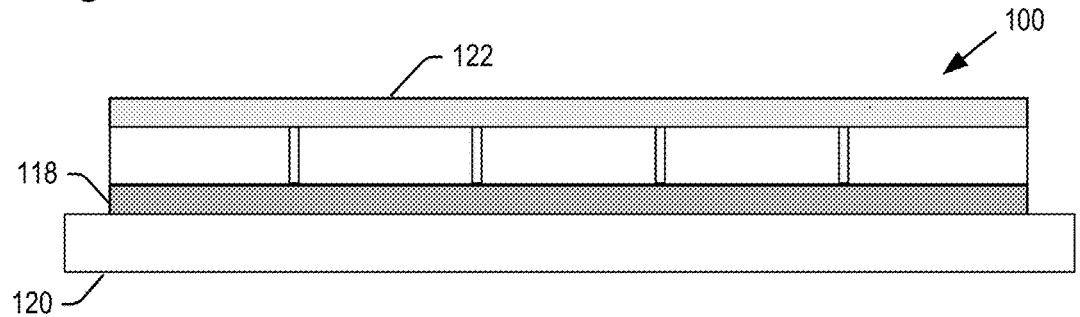
FIG. 8 is an edge view of the semiconductor wafer showing the grinding tape and DAF layer on opposed major surfaces of the semiconductor wafer.

Referring now to rear and edge views of FIGS. 7 and 8, respectively, after completion of the backgrind step 214, a layer of die attach film (DAF) 122 may be laminated onto the inactive surface 104 of the wafer 100 in step 216. The DAF layer 122 may be applied as a B-stage, tacky adhesive. Both surfaces of the DAF may initially have a liner, and the liners on both surfaces may be removed so that the exposed sticky surface of the DAF may stick onto wafer surface 104. DAF layer 122 may for example be Locktite Ablestik DAF tape from Henkel Corporation, Rocky Hill, CT, though the DAF layer 122 may be other models from other manufacturers in further embodiments. The relative thicknesses of wafer 100, DAF layer 122 and backgrind tape 118 shown in the figures is by way of example and is not to scale.

Figure 9:
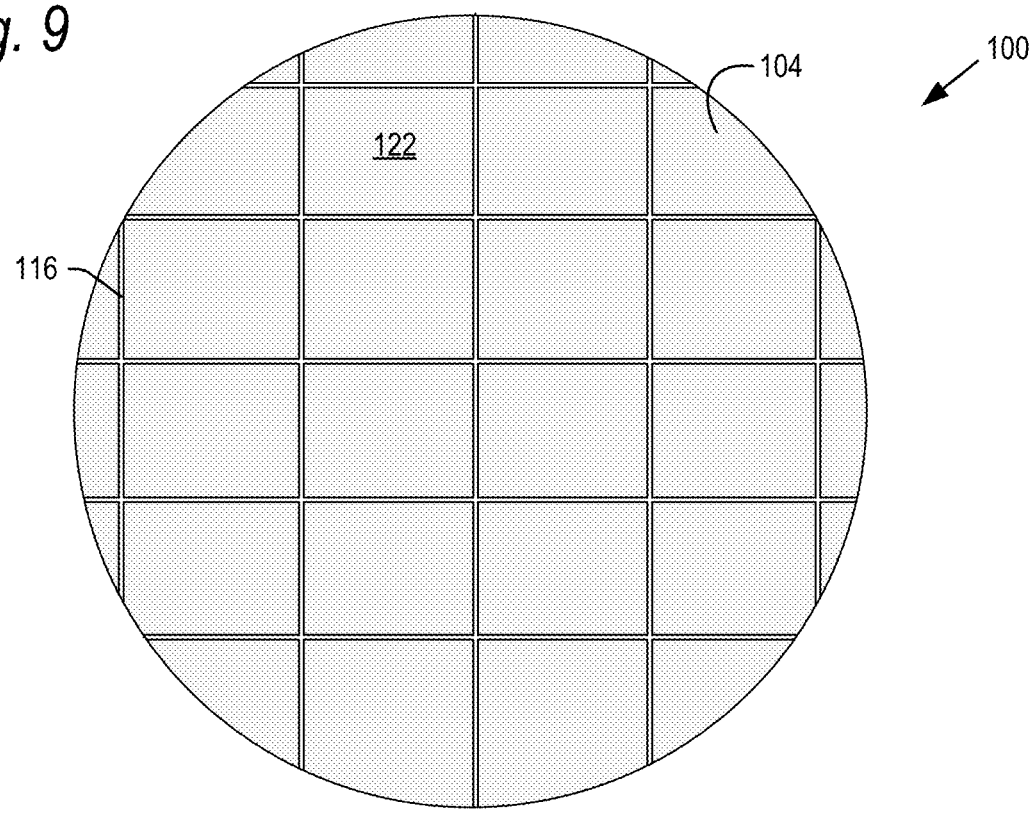
FIG. 9 is a rear view of the second major surface of the semiconductor wafer after cutting of the DAF layer.
Figure 10:
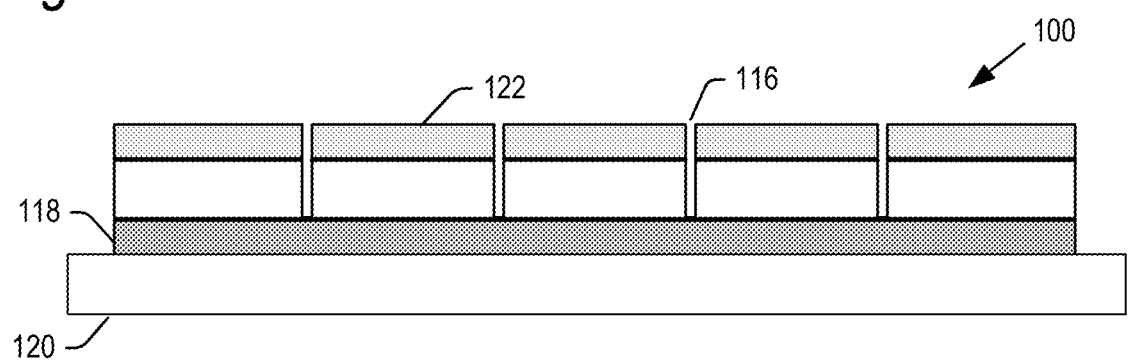
FIG. 10 is an edge view of the semiconductor wafer after cutting of the DAF layer.
Figure 11:
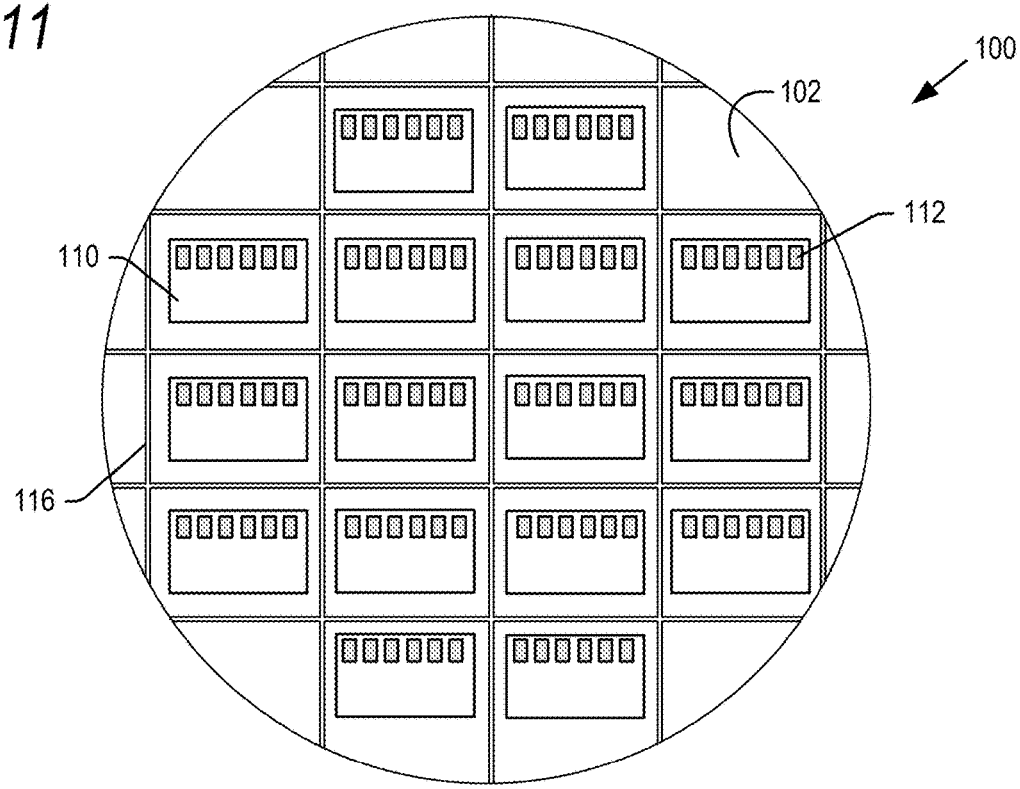
FIG. 11 is a front view of the first major surface of the semiconductor wafer after removal of the dicing tape.

Referring now to rear and edge views of FIGS. 9 and 10, respectively, with the wafer held on chuck 120, the DAF layer 122 may be cut in step 216 in a pattern aligning with and matching the cut lines 114 defining the individual semiconductor dies 110 of the wafer 100. Thus, the DAF layer 122 is cut along the edges of each semiconductor die 110 on wafer 100. The cutting of the DAF layer 122 may be done by laser, blade, waterjet, chemical etch or other method. As the cut lines 114 are not visible when cutting the DAF layer 122, fiducial markings on the wafer (such as a wafer notch) may be used to ensure the DAF layer 122 is cut in a pattern that matches cut lines 114.

Conventionally, a dicing tape would also be applied over the DAF layer 122, or applied as a combination DAF/dicing tape. However, as noted in the Background section, the dicing tape may be a source of stresses in the semiconductor dies when removing the dies from the wafer. In accordance with aspects of the present technology, a dicing tape is omitted. Conventionally, a dicing tape may be stretched to spread the dies on the wafer apart, and held in a stretched position with a wafer ring. As the dicing tape is omitted, a conventional wafer ring may also be omitted. In addition to the benefits of reducing stress as discussed herein, omission of the dicing tape and wafer ring also results in a reduction in fabrication costs.

Figure 12:
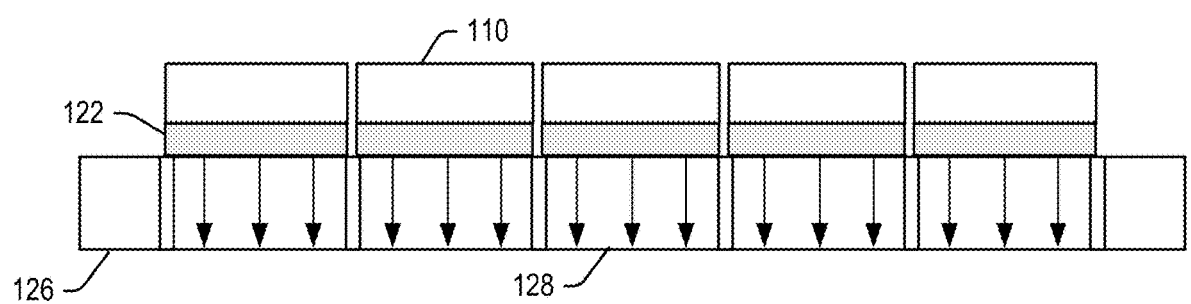
FIG. 12 is an edge view of the semiconductor wafer supported on a vacuum chuck.
Figure 13:
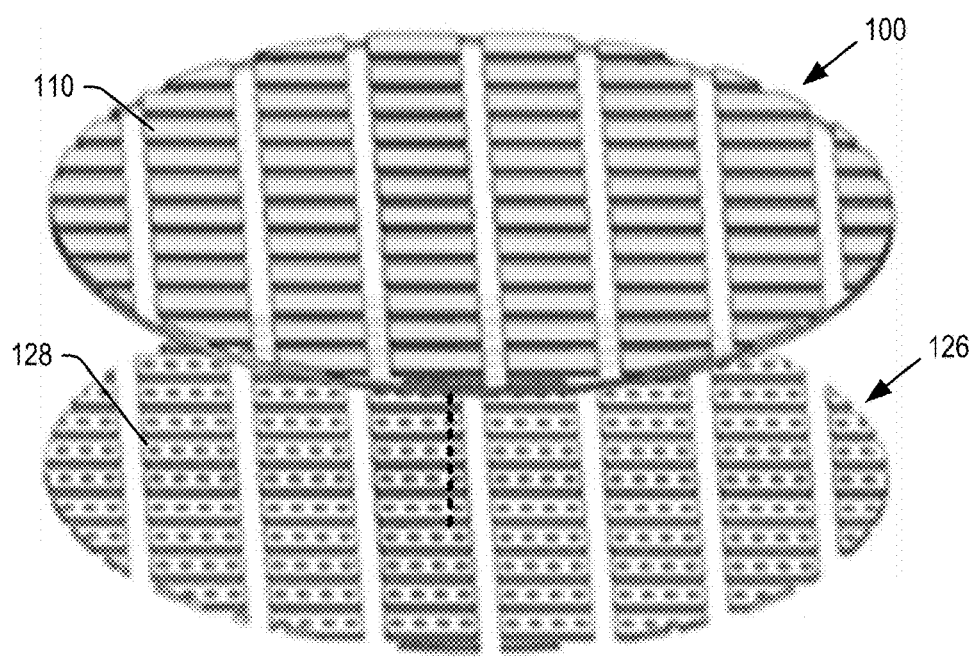
FIG. 13 is an exploded perspective view of the completed semiconductor wafer and vacuum chuck.
Figure 14:
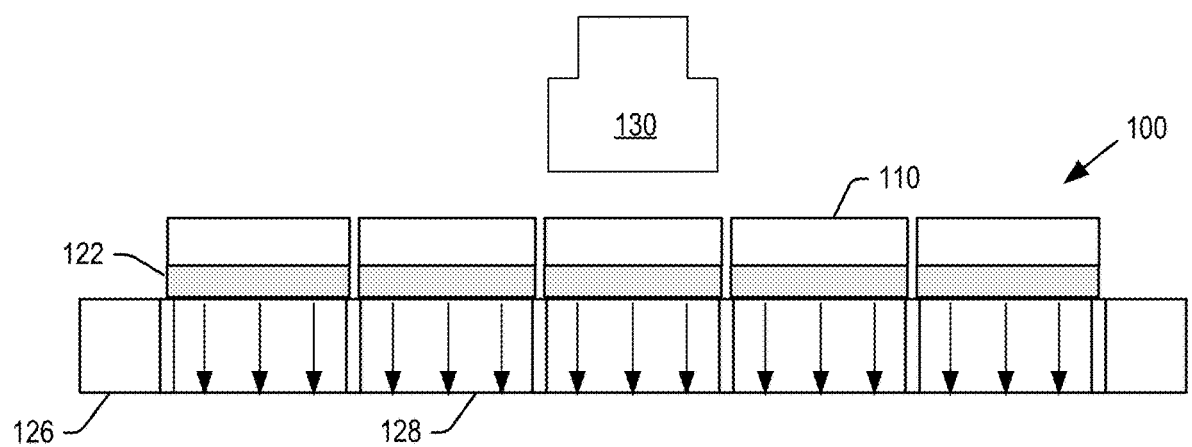
FIG. 14 is an edge view of a tip of a pick and place robot for transferring semiconductor dies away from the semiconductor wafer.

After cutting of the DAF layer 122, the wafer 100 may then be turned over in step 218 with the DAF layer 122 supported directly on a vacuum chuck 126 (shown in FIGS. 12 and 13). Thereafter, in step 220, the backgrind tape 118 on the first major surface 102 of the wafer 100 may be removed leaving the dies 110 exposed as shown in top and edge views of FIGS. 11 and 12, respectively. The dies 110 may be held on the chuck 126 while the backgrind tape 118 is removed by a negative pressure exerted on the dies by vacuum chuck 126.

FIG. 13 shows an exploded perspective view of the vacuum chuck 126 on which the inactive surface 104 of the wafer 100 is supported. As shown, the vacuum chuck 126 may have individual cells 128 that correspond with each semiconductor die 110, and align with each semiconductor die 110 when wafer 100 is supported on the chuck 126. Thus, each individual semiconductor die 110 may be held on chuck 126 by means of a negative pressure (arrows in FIG. 12) communicated through each cell 128 against the DAF layer 122 of each semiconductor die 110.

With the semiconductor dies 110 supported on vacuum chuck 126, a tip 130 of a pick and place robot (FIG. 14) may remove individual semiconductor dies 110 from the wafer 100 and assemble them into a semiconductor device as explained below. As compared to prior art processes, the semiconductor dies 110 may be removed using lower forces, thus subjecting the dies to lower stresses.

Figure 15:
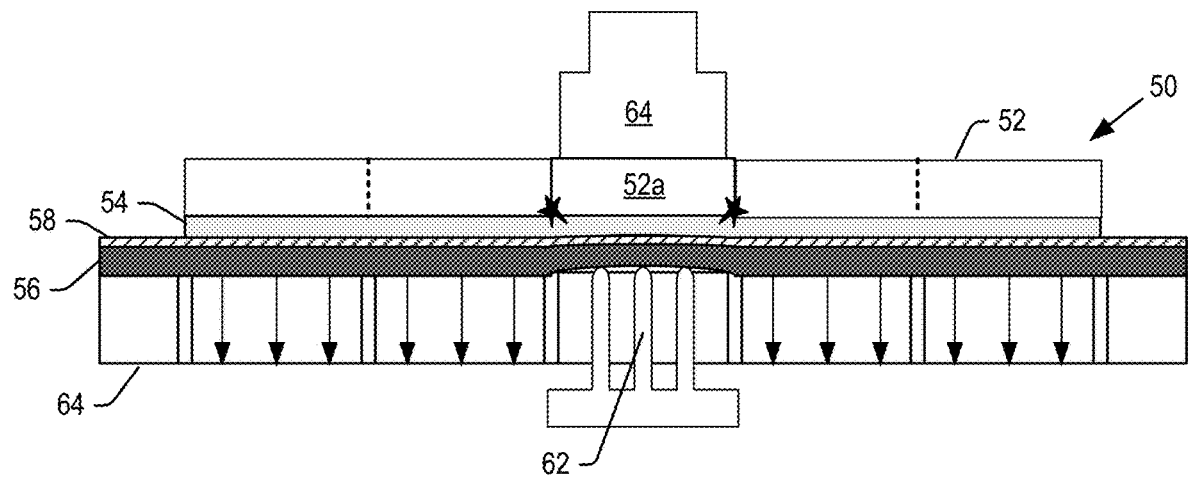
FIG. 15 is a prior art edge view of conventional wafer, a conventional ejector tip and a conventional pick and place robot for transferring semiconductor dies away from the semiconductor wafer.

In particular, FIG. 15 is an edge view showing conventional removal of semiconductor dies from a wafer using a conventional set up. As shown, the wafer 50 includes individual semiconductor dies 52, a DAF layer 54, a dicing tape 56 and an adhesive layer 58. The vacuum chuck 60 includes ejector pins 62. In order to remove a semiconductor die (52a), the tip 64 of a pick and place robot exerts a relatively large vacuum force on the upper surface of the die 52a, while the ejector pins 62 of a vacuum chuck 64 exert an upward for beneath the dies, to peel the die off of the dicing tape 56 and adhesive layer 58. In practice, the die 52a may be subject to forces in excess of about 0.6N to 1.0N. These forces are often too large for current-day semiconductor dies, and chipping, cracking or other damage to the dies can occur, especially at the edges of the dies.

Figure 16:
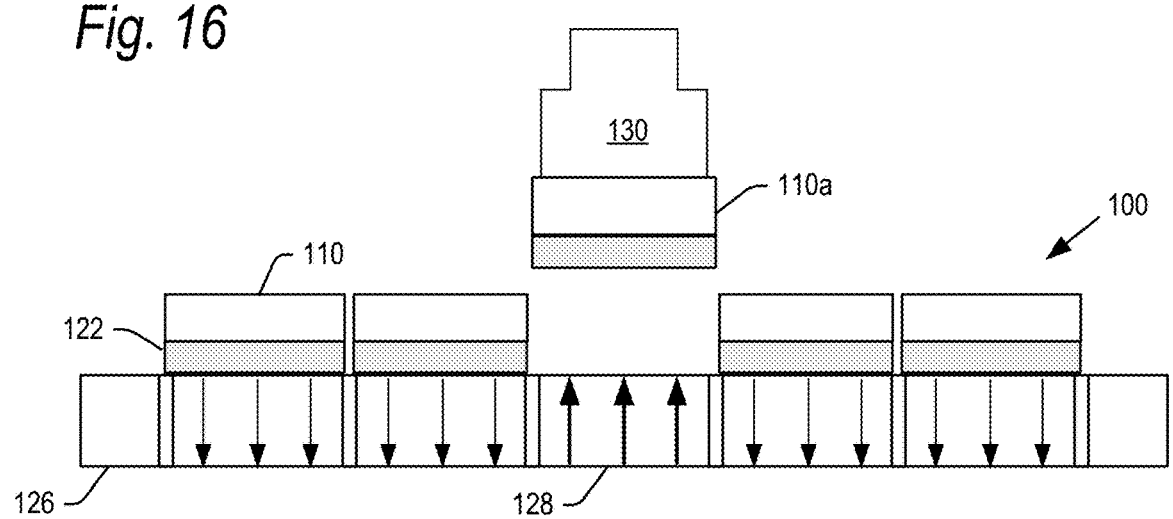
FIG. 16 is an edge view of a tip of a pick and place robot transferring a semiconductor die away from the semiconductor wafer.

By contrast, the tip 130 of the pick and place robot may remove a die 110 as shown in FIG. 16 with relatively lower forces according to the present technology. In order to remove a semiconductor die (110a), the tip 130 of the pick and place robot exerts a relatively small vacuum force on the upper surface of the die 110a, while the vacuum forces on cell 128 are turned off. Alternatively, in addition to the small vacuum force by tip 130, a fluid may be blown against the DAF layer 122 of die 110a to exert a positive pressure pushing the die 110a and DAF layer 122 off of the chuck 126. The die 110a and DAF layer 122 are severed and isolated from the other dies, and the only force needed is that to overcome the relatively small adhesive force between the B-stage DAF layer 122 and the cell 128 on which it rests. In embodiments, the die 110a and its DAF layer 122 may be removed from chuck 126 with forces of about 0.005N, at least two orders of magnitude less than dies made by conventional processes. These forces are sufficiently small to avoid chipping, cracking or other damage to the dies as they are removed by the pick and place robot.

Another problem with exerting large forces on semiconductor dies during pick and place is that conventional semiconductor dies are held to the dicing tape more strongly around its edges. Thus, as a die is pulled/ejected off of a dicing tape, it tends to bend which can damage the semiconductor die. With the complete isolation of a semiconductor die and DAF from the other dies, and omission of the dicing tape, this problem of bending is alleviated in the present technology.

Thus, the present technology generates semiconductor dies that are free of damage that occurs from peeling the semiconductor die from a dicing tape. As noted above, this damage may include chipping, cracking and other damage, which occurs in conventional fabrication processes using dicing tape, due to stresses on the semiconductor dies when the dies are peeled off of a dicing tape. This damage may also occur in conventional fabrication processes using dicing tape, due to bending of the semiconductor dies when the dies are peeled off of a dicing tape. Semiconductor dies of the present technology are free from this damage because the dicing tape used in conventional fabrication processes is omitted.

Figure 17:
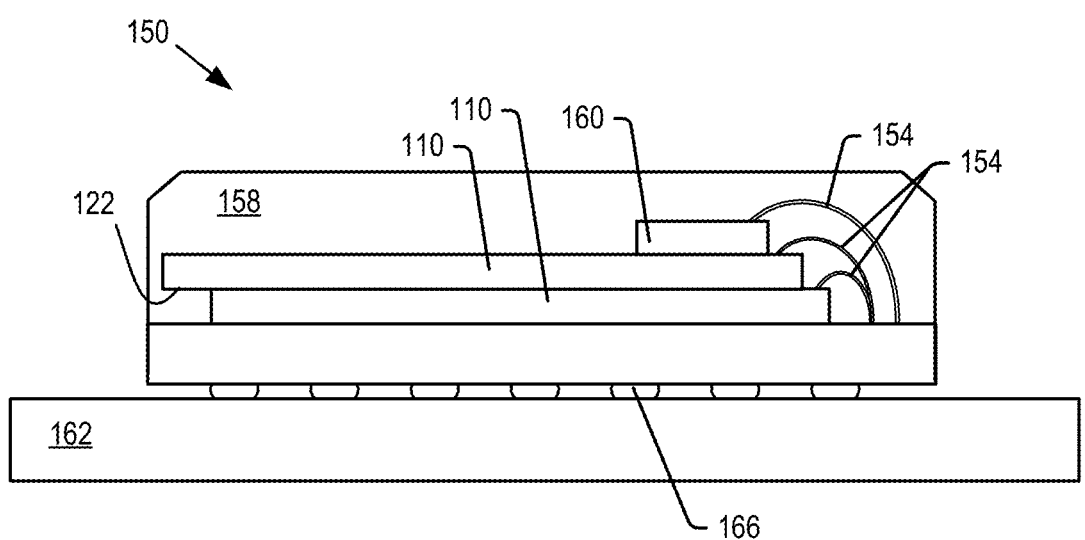
FIG. 17 is an edge view of a semiconductor device assembled for semiconductor dies made in accordance with the present technology.

FIG. 17 illustrates a semiconductor package 150 assembled in step 222 using semiconductor die 110 fabricated and ejected as described above. The semiconductor package 150 includes one or more dies 110 mounted on each other and a substrate 152 by the DAF layer 122 of each die. Once mounted on the substrate 152 and each other, the DAF layers 122 may be cured to a final C-stage solid, where the DAF is set and adheres the dies to each other and substrate 152. The dies are electrically coupled to the substrate 152, for example via wire bonds 154. A controller die 160 and passive components (not shown) may further be mounted on the substrate 152 or otherwise within the semiconductor device 150.

The semiconductor device 150 may for example be a ball grid array (BGA) package configured to be permanently bonded to a host device, such as a printed circuit board 162, by solder balls 166. The semiconductor device 150 may alternatively be a land grid array (LGA) package which may be removably inserted into and removed from a host device. In such an embodiment, the solder balls 166 may be replaced by contact fingers. The semiconductor device 150 may be encapsulated in a molding compound 158 to protect the semiconductor dies and other components against shock and moisture.

The present technology provides a method of preparing a die and assembling a semiconductor device, such as a solid-state memory device. One advantage of the present technology is that no dicing tape is used and there is no ring required to be placed around the wafer, as it is known that die cracking may be caused by the ring and/or removal of the dicing tape.

In summary, an example of the present technology relates to a semiconductor die, comprising: first and second major surfaces; a plurality of die bond pads formed in the first major surface; and a die attach film affixed to the second major surface; wherein the semiconductor die is free of damage that occurs from peeling the semiconductor die from a dicing tape.

In a further example, the present technology relates to a method of separating a semiconductor die formed on a semiconductor wafer, comprising the steps of: thinning the die by grinding a backside surface of the wafer; attaching a die attach film to the backside surface of the thinned wafer; supporting the thinned wafer on a vacuum chuck, with the die attach film in direct contact with the vacuum chuck; cutting the die attach film around an outline of the die with a laser; and removing the die from the wafer.

In another example, the present technology relates to a method of separating a semiconductor die from a semiconductor wafer, comprising the steps of: applying a die attach film to a surface of the semiconductor wafer; supporting the semiconductor wafer on a vacuum chuck, with the die attach film in direct contact with the vacuum chuck; and removing the semiconductor die from the wafer.

In a further example, the present technology relates to a method of assembling a semiconductor device, comprising the steps of: applying a die attach film as a B-stage adhesive to a surface of a semiconductor wafer; supporting the semiconductor wafer on a vacuum chuck, with the die attach film lying against the vacuum chuck; removing a semiconductor die from the wafer with a pick and place robot; transferring the semiconductor die into the semiconductor device; curing the die attach film to a C-stage adhesive to secure the semiconductor die within the semiconductor device.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of separating a semiconductor die from a semiconductor wafer, comprising the steps of:
    applying a die attach film adhesive to a surface of the semiconductor wafer;
    supporting the semiconductor wafer on a vacuum chuck, with a surface of the die attach film in direct contact with the vacuum chuck;
    cutting the die attach film around an outline of the semiconductor die with a laser after applying the die attach film to the semiconductor die;
    removing the semiconductor die from the wafer, said step of removing the semiconductor die from the wafer comprising the step of applying a first vacuum force to the surface of the die attach film while a second vacuum force is applied to one or more semiconductor dies around the semiconductor die, where the second vacuum force is greater than the first vacuum force; and
    transferring the semiconductor die into the semiconductor device.

2. The method of claim 1, further comprising the step of partially cutting the wafer around the semiconductor die through a first major surface of the wafer, and completing the separation of the semiconductor die from the wafer by thinning the wafer from a second major surface of the semiconductor wafer, before applying the die attach film to the second major surface.

3. The method of claim 1, wherein the step of removing the semiconductor die from the wafer comprises the step of overcoming an adhesive force between the die attach film and the vacuum chuck.

4. The method of claim 1, wherein the step of removing the semiconductor die from the wafer comprises the step of gripping a first surface of the semiconductor die with the tip of a pick and place robot.

5. The method of claim 4, wherein the step of removing the semiconductor die from the wafer comprises the step of exerting a negative pressure against semiconductor dies around the semiconductor die being removed.

6. The method of claim 1, wherein the step of supporting the semiconductor wafer on the vacuum chuck comprises the step of supporting the wafer on a vacuum chuck configured to supply a positive or negative pressure to the semiconductor die independently of other semiconductor dies in the wafer.

7. A method of assembling a semiconductor device, comprising the steps of:
    applying a die attach film as a B-stage adhesive to a surface of a semiconductor wafer, the wafer comprising a number of semiconductor dies;
    cutting through the die attach film around outlines of the semiconductor dies;
    after cutting through the die attach film, turning the wafer over and supporting the semiconductor wafer on a vacuum chuck, with the die attach film lying against the vacuum chuck;
    removing a semiconductor die from the wafer with a pick and place robot;
    transferring the semiconductor die into the semiconductor device;
    curing the die attach film to a C-stage adhesive to secure the semiconductor die within the semiconductor device.

8. The method of claim 7, further comprising the step of cutting the die attach film around an outline of the semiconductor die after applying the die attach film to the semiconductor die.

9. The method of claim 7, wherein the step of removing the semiconductor die from the wafer comprises the step of overcoming an adhesive force between the die attach film and the vacuum chuck.

10. The method of claim 7, wherein the step of removing the semiconductor die from the wafer comprises the step of exerting a negative pressure against semiconductor dies around the semiconductor die being removed.

11. The method of claim 10, wherein the step of removing the semiconductor die from the wafer comprises the step of blowing a fluid against the semiconductor die being removed, while the negative pressure is exerted on the semiconductor dies around the semiconductor die being removed.

12. The method of claim 7, wherein the step of supporting the semiconductor wafer on a vacuum chuck comprises the step of supporting the wafer on a vacuum chuck configured to supply a positive or negative pressure to the semiconductor die independently of other semiconductor dies in the wafer.

* * * * *